(12) United States Patent
Prinz et al.

(10) Patent No.: US 7,700,439 B2
(45) Date of Patent: Apr. 20, 2010

(54) SILICIDED NONVOLATILE MEMORY AND METHOD OF MAKING SAME

(75) Inventors: Erwin J. Prinz, Austin, TX (US);
Ko-Min Chang, Austin, TX (US);
Robert F. Steimle, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 86 days.

(21) Appl. No.: 11/376,410

(22) Filed: Mar. 15, 2006

(65) Prior Publication Data

US 2007/0218633 A1    Sep. 20, 2007

(51) Int. Cl.
*H01L 21/336* (2006.01)
(52) U.S. Cl. ............... 438/267; 257/288; 257/E21.209
(58) Field of Classification Search .......... 438/267; 257/288, E21.209
See application file for complete search history.

(56) References Cited

U.S. PATENT DOCUMENTS

| | | | |
|---|---|---|---|
| 5,408,115 A | 4/1995 | Chang | |
| 5,824,584 A | 10/1998 | Chen et al. | |
| 5,969,383 A | 10/1999 | Chang et al. | |
| 6,816,414 B1 | 11/2004 | Prinz | |
| 6,964,902 B2 | 11/2005 | Steimle et al. | |
| 7,456,465 B2 | 11/2008 | Prinz et al. | |
| 2005/0176202 A1 | 8/2005 | Hisamoto et al. | |
| 2005/0180210 A1 | 8/2005 | Harari et al. | |
| 2006/0017094 A1 | 1/2006 | Kim et al. | |
| 2006/0203543 A1* | 9/2006 | Jeong ................... | 365/185.01 |

OTHER PUBLICATIONS

International Search Report and Written Opinion.

* cited by examiner

*Primary Examiner*—Brook Kebede
*Assistant Examiner*—Tony Tran
(74) *Attorney, Agent, or Firm*—Kim-Marie Vo (57) ABSTRACT

A memory device is formed on a semiconductor substrate. A select gate electrode and a control gate electrode are formed adjacent to one another. One of either the select gate electrode or the control gate electrodes is recessed with respect to the other. The recess allows for a manufacturable process with which to form silicided surfaces on both the select gate electrode and the control gate electrode.

11 Claims, 6 Drawing Sheets

SILICIDED NONVOLATILE MEMORY AND METHOD OF MAKING SAME

FIELD OF THE INVENTION

The present disclosure relates, in general, to memory devices, and more particularly, to a nonvolatile memory device and methods of siliciding both select and control gates of the device.

RELATED ART

It has been shown that non-volatile memory single-transistor bitcells having a dielectric with embedded nanoclusters for use as discrete charge storage elements, can be charged with electrons using hot carrier injection (HCI injection), HCI injection with reverse well/source bias, Fowler-Nordheim (FN) tunneling, or source side injection (SSI). HCI and SSI programming result in an efficient bitcell and fast programming, but the programming current for SSI programming is 10-100 times smaller than for HCI programming. While HCI programming can be achieved in a 1-transistor bitcell, SSI programming requires a bitcell with two gates in close proximity having a control gate and a select gate. Such a bitcell is known as a split gate bitcell. Bitcell programming times are 1-10 μsec, but read access times for nonvolatile memory embedded in a microcontroller are much faster, 10-20 nsec. Because of the very fast read access time, control of the RC delay on the control and select gates is becoming of higher importance. This is especially true for gates that may not be connected to metal lines for long distances. One way to reduce this RC delay is by silicidation of not only the select gate portion of the memory device but by silicidation of the control gate portions of the memory device as well.

Accordingly, a method of forming a memory device whereby control gates and select gates are silicided is needed. Additionally, methods for separating the control gate silicide from the select gate silicide are needed.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present disclosure.

DETAILED DESCRIPTION

FIGS. 1-8 show cross-sectional views of a semiconductor device during the various stages of manufacture of a memory device including nanoclusters and silicided select gates and control gates according to a first embodiment of the present invention.

Figure 1:
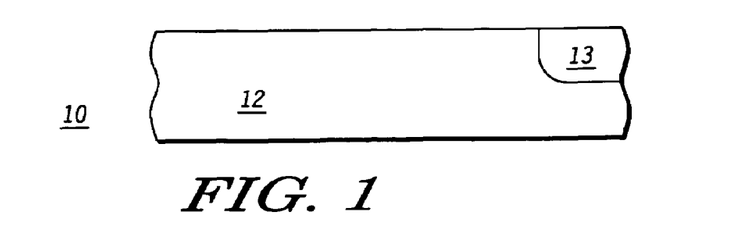
FIG. 1 is a cross-sectional view of a nonvolatile memory device showing the portion to be used for the memory including a shallow trench isolation according to one embodiment of the present disclosure.

FIG. 1 is a cross-sectional view of a nonvolatile memory (NVM) device 10 according to one embodiment of the present disclosure. Memory device 10 includes a substrate 12 that contains bitcell wells of a first conductivity type that may overlie a deep well of a second conductivity type, opposite the first conductivity type. In one embodiment, the first conductivity type includes p-type and the second conductivity type includes n-type dopant. These are not shown for clarity but are known to those of skill in the art. Memory device also includes an isolation structure 13 such as shallow trench isolation. Other isolation structures such as LOCOS are also contemplated.

Figure 2:
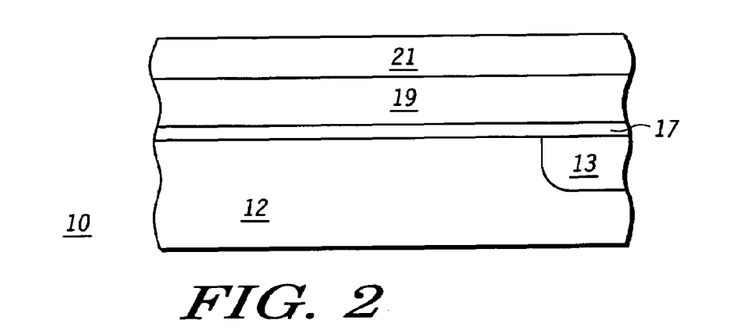
FIG. 2 is a cross-sectional view of a nonvolatile memory device having a select gate oxide with a first polysilicon layer and a nitride layer disposed above according to an embodiment of the present disclosure.

FIG. 2 shows the memory device 10 after the gate oxide layer 17 has been formed. Typically this oxide is on the order of approximately 20-50 Å and has been thermally grown. Layer 17 can also be formed by other methods including chemical vapor deposition and can also be formed from another dielectric such as silicon oxynitride, hafnium oxide, aluminum oxide, or the like. A first layer of polysilicon 19 is then formed over oxide layer 17. Polysilicon layer 19 will serve as the conductive layer for the select gate portion of the NVM device. In one embodiment, polysilicon layer 19 is approximately 1000 Å thick and includes an n-type dopant. Nitride layer 21 is deposited over polysilicon layer 19. Nitride layer 21 may be used as an etch stop layer for subsequent processing steps as discussed later. In other embodiments, layer 21 may include silicon nitride, silicon oxynitride, silicon rich oxynitride, or the like. Nitride layer 21 is approximately 700-1000 Å or thicker and is formed by conventional processes including chemical vapor deposition (CVD).

Figure 3:
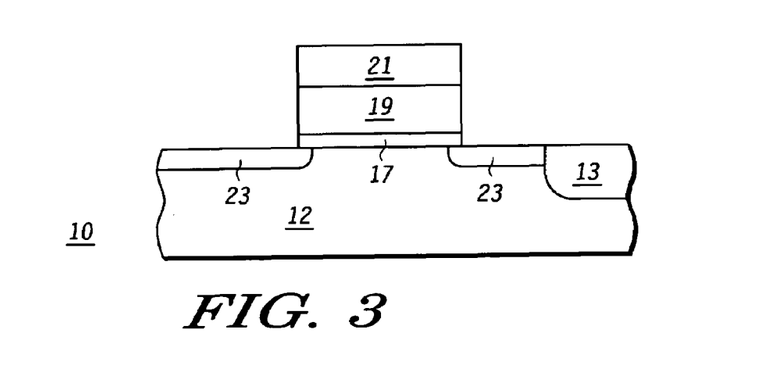
FIG. 3 is a cross-sectional view of a nonvolatile memory device after the first polysilicon layer has been patterned and etched according to an embodiment of the present disclosure.

FIG. 3 is a cross-sectional view of the NVM device after polysilicon layer 19 has been patterned and etched using conventional lithographic and etch methods. At this time, the well doping under the area that will become the control gate can be differentiated from the well doping under the select gate with a well implant layer 23. This additional well implant can be n-type or p-type, depending on the relative values of the control and select gate threshold voltages.

Figure 4:
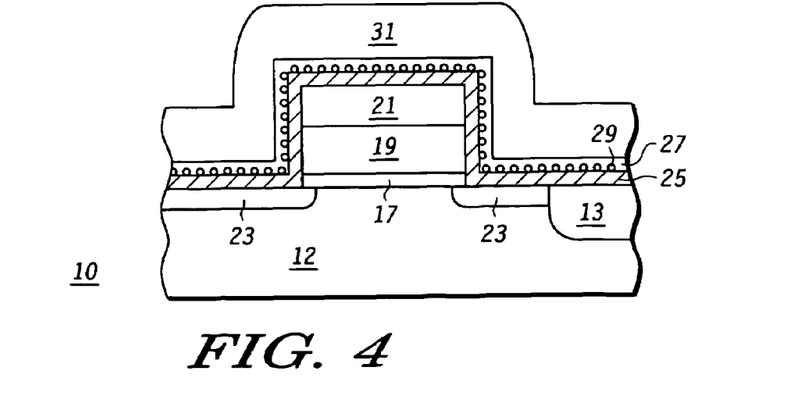
FIG. 4 is a cross-sectional view of a nonvolatile memory device after formation of nanoclusters for charge storage and a second polysilicon layer for formation of the control gate to an embodiment of the present disclosure.

FIG. 4 is a cross-sectional view of the memory device after formation of a layer of oxide 25. The oxide layer 25 is formed to a thickness of approximately 50-70 Å and is thermally grown. Oxide layer 25 can also be another dielectric material such as silicon oxynitride or a high dielectric constant (high K) and may be formed by other methods including CVD, atomic layer deposition (ALD), or the like. Nanoclusters 29 can be formed by CVD, by aerosol deposition techniques, by spin on coating techniques, by self assembly techniques such as e.g. annealing a thin film to form the nanoclusters, or the like. Typical nanoclusters include Si, SiGe, Al, Au, a silicon and germanium alloy, or other types of conductive material or doped or undoped semiconductive material. The nanoclusters are formed at the preferred densities in the range of $5 \times 10^{11}$ $cm^{-2}$ to $1.0 \times 10^{12}$ $cm^{-2}$ and a diameter of 50-150 Å or larger and with a coverage of approximately 25%. A layer of dielectric 27 may then be deposited to serve as the dielectric separating the previously deposited nanoclusters 29 from the control gate. Dielectric layer 27 is typically $SiO_2$ and may be deposited to a thickness of 80-120 Å. Dielectric layer 27 can also be a layer of higher permittivity such as aluminum oxide. A second layer of polysilicon 31 is formed over dielectric 27. Polysilicon 31 will serve as the conductive layer for the control gate portion of the NVM device. In one embodiment, polysilicon layer 31 is approximately 1500 Å thick and may include a p-type dopant. The thickness of polysilicon layer 31 will be dependent on the required length of the control gate so may be either less than or greater than 1500 Å thick.

Figure 5:
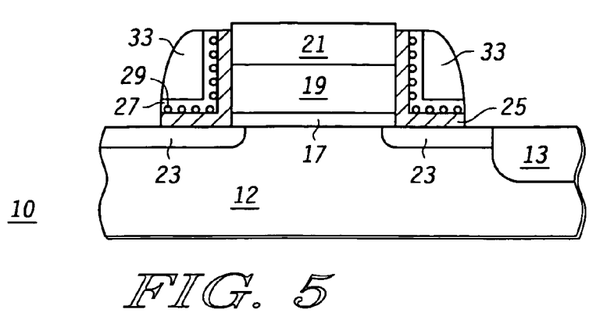
FIG. 5 is a cross-sectional view of a nonvolatile memory device after the control gate has been patterned and etched to an embodiment of the present disclosure.

Turning now to FIG. 5, a cross sectional view of the memory device is shown after etch processes have been performed to form the control gate 33 in a sidewall spacer configuration. In one embodiment, an anisotropic dry etch is used. A further process may then be used to remove the nanoclusters and oxide from the top surface of nitride layer 21 while retaining the nanoclusters and oxide that separate the control gate portion of the device from the select gate portion of the device. This may be done by a dry etch or a combination of dry and wet etch processes and can also remove nitride layer 21.

Figure 6:
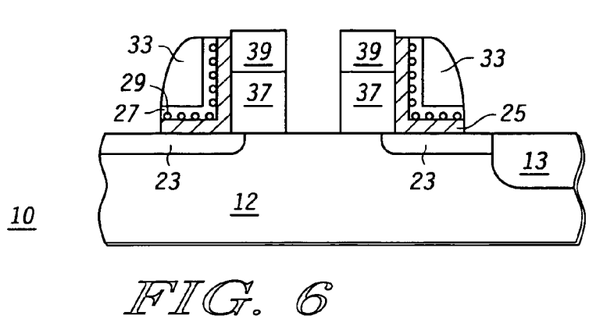
FIG. 6 is a cross-sectional view of a nonvolatile memory device after the select gate has been patterned and etched to an embodiment of the present disclosure.

Lithographic and etch processes are then used to form the select gates 37 as shown in FIG. 6. Select gate 37 is comprised of both polysilicon layer 19 as well as oxide layer 17. Nitride layer 21 is now nitride layers 39 over the separate select gate regions 37. In a preferred embodiment, nitride layers 39 are then removed. This may be performed using an isotropic wet etch in hot phosphoric acid without using a mask. At this time source and drain extensions may be formed by well know implantation techniques. The extensions may be doped n-type.

Figure 7:
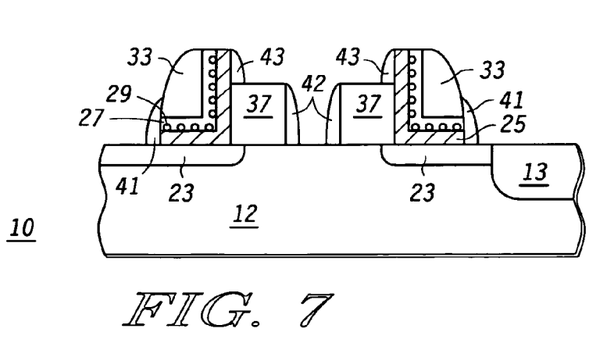
FIG. 7 is a cross-sectional view of a nonvolatile memory device after nitride spacers have been formed according to an embodiment of the present disclosure.

A layer of nitride or like material is then formed over the entire structure. The nitride may be formed by CVD or like processes and, according to one embodiment, be approximately 700 Å thick. A conventional anisotropic nitride etch process may then be used to form sidewall spacers 41 adjacent the control gates 33, sidewall spacers 42 separating the select gates 37, and sidewall spacers 43 that will further serve to separate oxide layer 25 from any further materials formed overlying select gates 37. Sidewall spacers 41, 42, and 43 are shown in FIG. 7.

Figure 8:
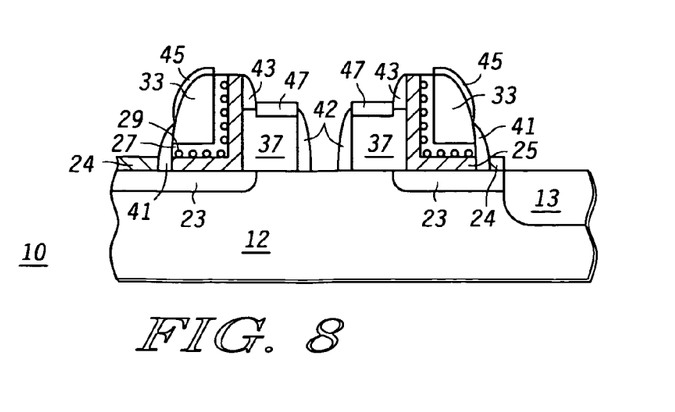
FIG. 8 is a cross-sectional view of a nonvolatile memory device after the control gate and the select gate have been silicided according to an embodiment of the present disclosure.

FIG. 8 is a cross sectional view of the resulting structure in accordance with the first embodiment of the present invention. The structure of FIG. 7 has been processed to form select gate silicide 47, control gate silicide 45, and silicided source and drain areas 24. In a preferred embodiment, a layer of metal such as titanium, tungsten, cobalt, nickel, an alloy or other like material is blanket deposited. An anneal reacts the metal with any exposed silicon to form a silicide. Any unreacted metal is subsequently removed. A final anneal can then be performed. The result is a memory device with silicided control gates and select gates whereby the silicided areas are electrically isolated from one another by dielectric materials. Sidewall spacers 41, 42, and 43 are silicide resistant areas and will, therefore, remain essentially unchanged.

It is noted that one of ordinary skill would see that by careful patterning of the select gate area, it would be possible to contact the control gate area in a way that no extra masking step for the control gate would be necessary to define the control gate contact area. The masking layer used to define select gate 37, is shaped such that the subsequent sidewall spacer control gates, 33, are contiguous and provide sufficient area to permit a lithographically defined contact to be patterned. This is more easily seen in FIG. 21 whereby a single contact 100 is seen to contact the control gates 33 prepared in the sidewall spacer method of the aforementioned embodiment.

Figure 9:
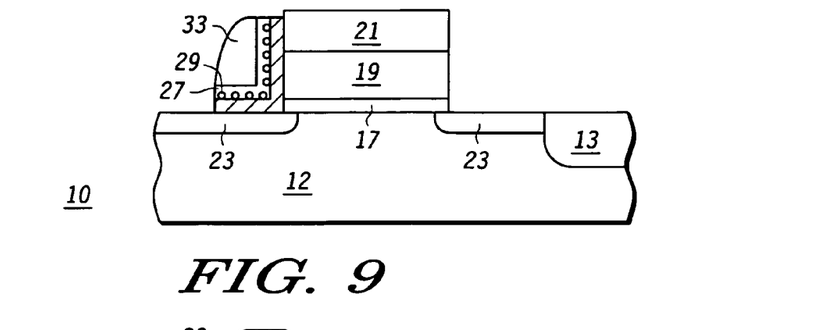
FIG. 9 is a cross-sectional view of a nonvolatile memory device according to another embodiment of the present disclosure after the structure in FIG. 5 has undergone a patterning and etching of one bitcell control gate.
Figure 10:
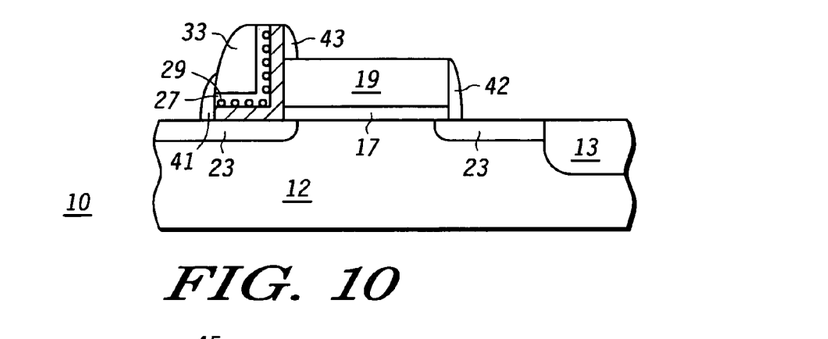
FIG. 10 is a cross-sectional view of a nonvolatile memory device after the processes of FIG. 9, and after the device has had nitride sidewall spacers and nitride spacers formed.
Figure 11:
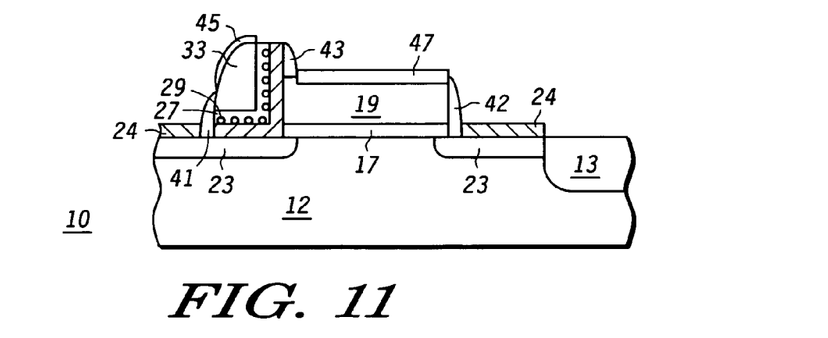
FIG. 11 is a cross-sectional view of a nonvolatile memory device after the processes of FIG. 10 and after the control gate and the select gate have been silicided.

FIGS. 9-11 show cross-sectional views of a semiconductor device during the various stages of manufacture of a memory device including nanoclusters and a silicided select gate and control gate according to a second embodiment of the present invention.

Turning now to FIG. 9, a structure is shown after the structure of FIG. 5 has been patterned and etched according to a preferred embodiment resulting in a single bitcell device with control gate 33. Conventional masking techniques are used subsequent to the formation of the spacer control gate to form the single bitcell. A conventional dry etch process, a wet etch or a combination of both may be used to attain the structure shown in FIG. 9. Nitride layer 21 may then be removed using a masked or unmasked isotropic wet etch in hot phosphoric acid, or an anisotropic dry etch with conventional masking techniques.

A layer of nitride or like material is then formed over the entire structure. The nitride may be formed by CVD or like processes and, according to one embodiment, be approximately 700 Å thick. A conventional anisotropic nitride etch process may then be used to form sidewall spacer 42 and sidewall spacer 43 that will further serve to separate oxide layer 25 from any further materials formed overlying select gate 37 as shown in cross section in FIG. 10.

FIG. 11 is a cross sectional view of the resulting structure in accordance with the second embodiment of the present invention. The structure of FIG. 10 has been further processed to form select gate silicide 47, control gate silicide 45, and silicided source and drain areas 24.

Figure 12:
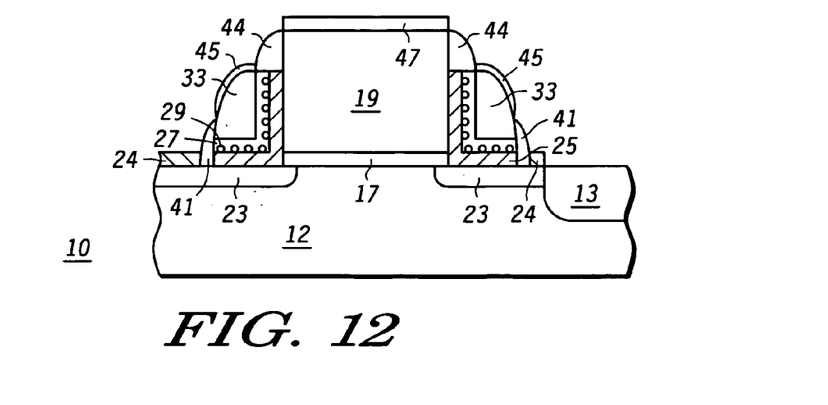
FIG. 12 is a cross-sectional view of a nonvolatile memory device according to another embodiment of the present disclosure after the processes of FIG. 4 showing silicided control and select gates for a 2-bit storage cell.

FIG. 12 is a cross section of a third embodiment of the present invention showing a 2-bit memory cell. The structure of FIG. 4 has been etched in a manner similar to that described for FIG. 5. In this embodiment, however, the process step that removes the nanoclusters 29, oxide 25, and control gate 33 is performed in a manner that recesses control gates 33 below select gate 37. In a preferred embodiment, the select gate 37 has been masked to allow for the anisotropic etch of control gates 33 as well as nanoclusters 29 and oxide 25. A combination of anisotropic etch with isotropic etch may also be performed. The subsequent formation of a blanket nitride layer is followed by an anisotropic etch. This results in sidewall spacers 44 and 41. In this embodiment, sidewall spacers 44 overlie the nanoclusters 29 and oxide layer 25 while sidewall spacers 41 overlie control gates 33. In a preferred embodiment, spacers 41 overly only a small portion of control gate 33. Further processing is performed whereby a layer of metal such as titanium, tungsten, cobalt, nickel, an alloy or other like material is blanket deposited. An anneal reacts the metal with any exposed silicon to form a silicide. Any unreacted metal is subsequently removed. A final anneal can then be performed. The result is a memory device with silicided control gates that are recessed with respect to silicided select gates.

One of skill in the art would realize that a single bit memory cell could also be formed in the manner described in FIG. 12 for the 2-bit memory cell. For the single bit memory cell, the result of processing would be a single spacer on one side of the select gate as opposed to the double spacer as shown in FIG. 12.

Figure 13:
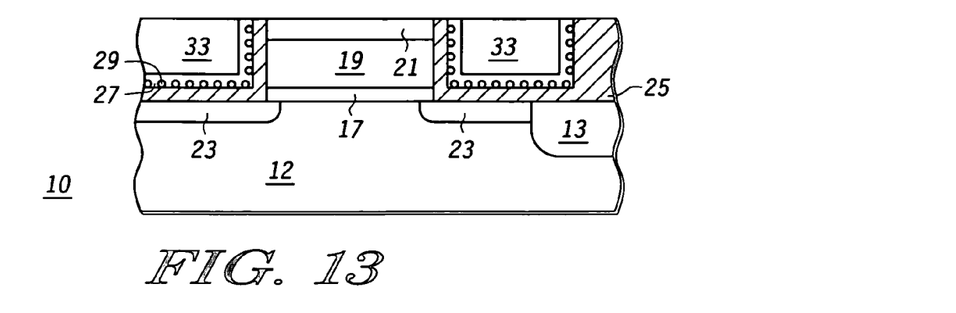
FIG. 13 is a cross-sectional view of a nonvolatile memory device according to another embodiment of the present disclosure after the processes of FIG. 4 and after the polysilicon has been polished to form a control gate.
Figure 14:
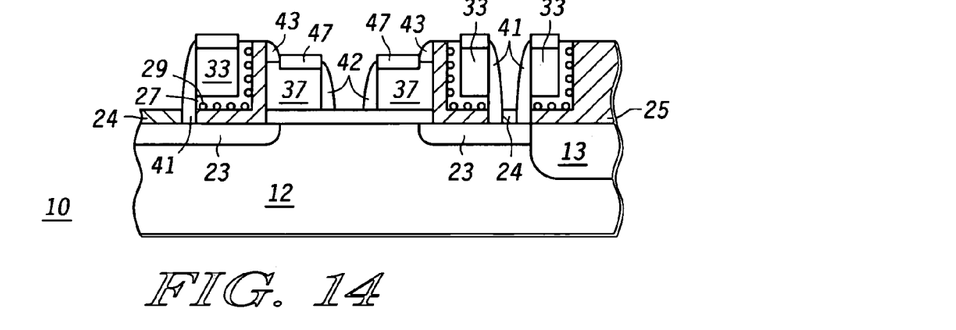
FIG. 14 is a cross-sectional view of the nonvolatile memory device of FIG. 13 after formation of the select gate and silicidation of both control gate and select gates.

FIGS. 13 and 14 are cross sectional views of a memory device according to a fourth embodiment of the present invention. Beginning with the structure of FIG. 4, a polish process such as chemical mechanical polishing (CMP) is used to planarize the second layer of polysilicon 31 as well as remove nanoclusters 29 and oxide 27 overlying nitride 21. Multiple slurries may be used to achieve the best planarity of the structure. Polishing is stopped when nitride layer 21 is cleared of polysilicon layer 31. A blanket etchback process is also contemplated for the planarization of the second layer of polysilicon 31.

FIG. 14 shows a cross sectional view of a memory device according to the fourth embodiment of the present invention. Lithographic and etch processes define control gates 33 and select gates 37. An anisotropic polysilicon etch is preferred. At this point, the processes as described for the first embodiment and shown in FIGS. 6-8 may be performed. The resulting structure is an essentially planar silicided control gate 33 with recessed and silicided select gates 37.

Figure 15:
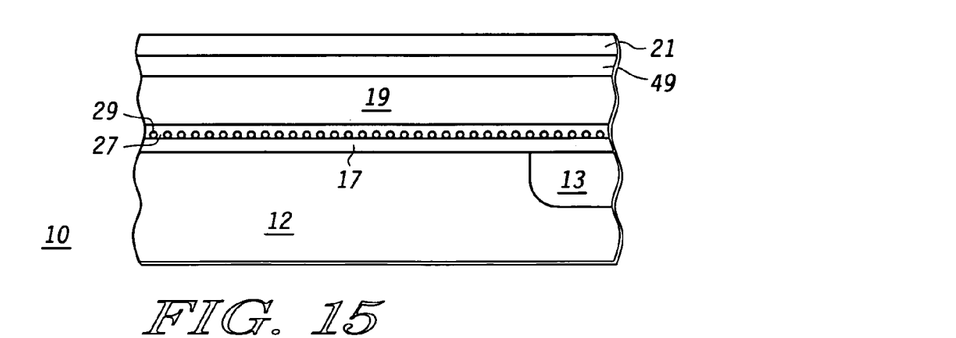
FIG. 15 is a cross-sectional view of a nonvolatile memory device according to another embodiment of the present disclosure whereby the nanoclusters are deposited prior to forming the first polysilicon layer.

FIGS. 15-20 are cross sectional views of a memory device according to a fifth embodiment of the present invention. Turning first to FIG. 15, a gate oxide layer 17 is formed overlying a substrate 12. Typically oxide layer 17 is on the order of approximately 50-70 Å and has been thermally grown. Layer 17 can also be formed by other methods including chemical vapor deposition and can also be formed from another dielectric such as silicon oxynitride, hafnium oxide, aluminum oxide, or the like. Nanoclusters 29 are then formed by island growth during CVD, by aerosol deposition techniques, by spin on coating techniques, by self assembly techniques such as e.g. annealing a thin film to form the nanoclusters, or the like. Typical nanoclusters include Si, SiGe, Al, Au, a silicon and germanium alloy, or other types of conductive material or doped or undoped semiconductive material. The nanoclusters are formed at the preferred densities in the range of $5\times10^{11}$ cm$^{-2}$ to $1.1\times10^{12}$ cm$^{-2}$ and an undoped diameter of 50-150 Å or larger and with a coverage of approximately 25% or less. A layer of dielectric 27 is then deposited which will serve as the oxide separating the subsequently deposited nanoclusters 29 from the control gate. Dielectric layer 27 is typically SiO$_2$ and is deposited to a thickness of 80-120 Å. A first layer of polysilicon 19 is formed over nanoclusters 29. Polysilicon 19 will serve as the conductive layer for the control gate portion of the NVM device. In one embodiment, polysilicon layer 19 is approximately 1500 Å thick. An oxide layer is formed overlying polysilicon layer 19. Oxide layer 49 may be deposited by CVD or may be thermally grown. A preferred thickness is approximately 700-1000 Å. A nitride layer 21 is formed overlying oxide layer 49. Nitride layer 21 may be used as an etch stop layer for subsequent processing steps as discussed later. In other embodiments, layer 21 may include silicon nitride, silicon oxynitride, silicon rich oxynitride, or the like. Nitride layer 21 is approximately 700-1000 Å or thicker and is formed by conventional processes including CVD.

Figure 16:
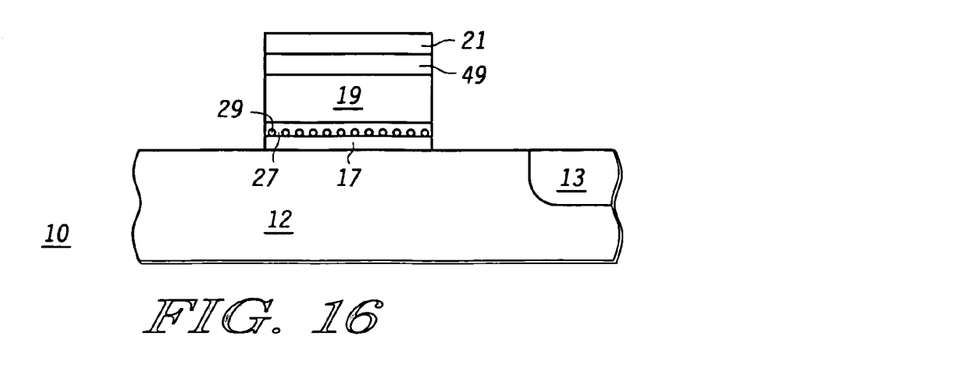
FIG. 16 is a cross-sectional view of the non-volatile memory device from FIG. 15 after the layers have been patterned and etched.

Turning now to FIG. 16, lithographic and etch processes have been performed resulting in a patterned first gate structure. This structure may go on to form the control gate for the memory device.

Figure 17:
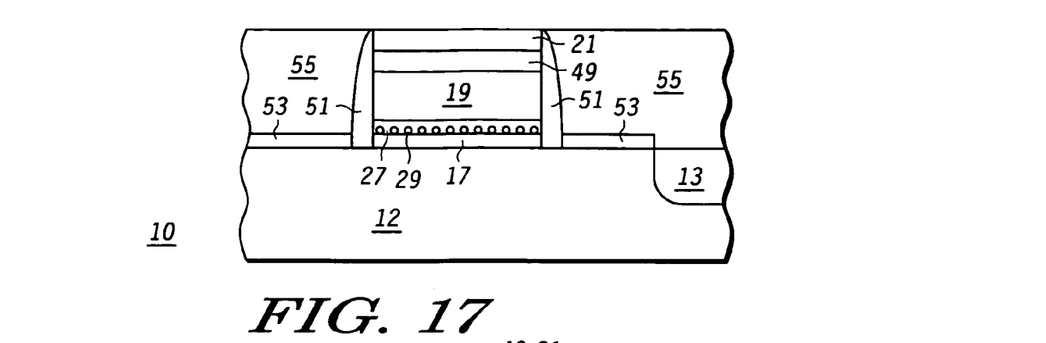
FIG. 17 is a cross-sectional view of the non-volatile memory device from FIG. 16 after formation of oxide sidewall spacers and deposition of a second polysilicon layer.

FIG. 17 is a cross sectional view after further processing on the structure from FIG. 16. A layer of oxide, 51, is deposited using a CVD or similar technique. A subsequent anisotropic etch is used to form oxide sidewall spacers on control gate polysilicon structure, 19. A layer of oxide 53 is formed by either a thermal growth, by CVD or the like. A preferred thickness is 20-50 Å. Layer 53 can also be formed by other methods well known in the art for formation of oxides Layer 53 can also be formed from another dielectric such as silicon oxynitride, hafnium oxide, aluminum oxide, or the like. A second layer of polysilicon 55 is then formed. Polysilicon 55 will serve as the conductive layer for the select gate portion of the NVM device. In one embodiment, polysilicon layer 55 is approximately 1500 Å thick and may include a p-type dopant. A polish process, such as CMP, is then used to planarize the structure.

Figure 18:
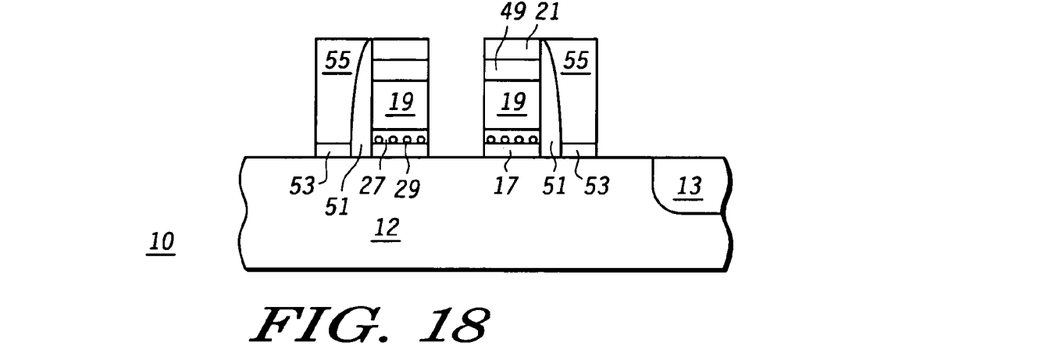
FIG. 18 is a cross-sectional view of the non-volatile memory device from FIG. 17 after the control gates and the select gates have been patterned and etched.

Polysilicon layer 55 is then patterned and etched to form select gates 55. An anti-reflective coating (ARC) may be formed over the entire structure at this time to facilitate fine mask patterning. In a preferred embodiment nitride layer 49, oxide layer 21, polysilicon layer 19, nanoclusters 29, and oxide layer 17 are simultaneously patterned and etched to define what will become the control gate portion of the memory device. A patterning and etching process for the control gate portion of the memory device occurring subsequent to the definition of the select gate is also contemplated. The resulting cross sectional view is shown in FIG. 18.

Figure 19:
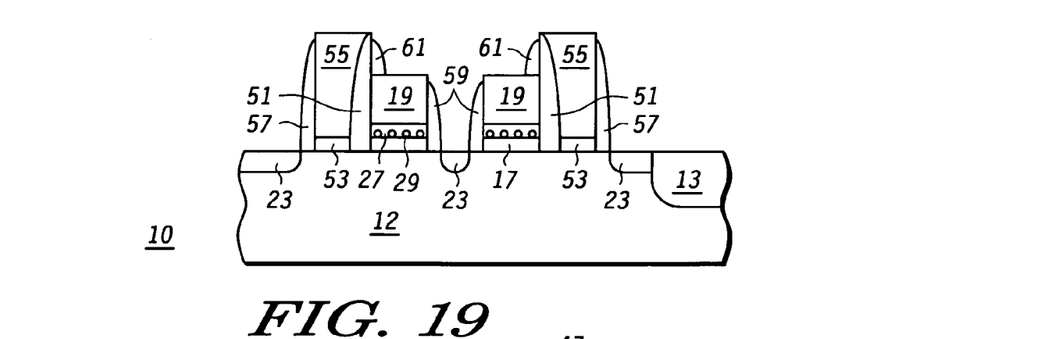
FIG. 19 is a cross-sectional view of the non-volatile memory device from FIG. 18 after formation of nitride sidewall spacers and nitride spacers for the select gates and control gates.

FIG. 19 is a cross sectional view of the memory device after further processing has occurred. Nitride layer 21 has been removed, preferably by using an isotropic wet etch in hot phosphoric acid or an anisotropic dry etch. Oxide layer 49 is also removed and may be removed in a similar manner as nitride layer 21. The resulting structure is one in which the control gate portion of the memory device is recessed with respect to the select gate portion of the memory device. A blanket nitride layer is then formed which is then anisotropically etched to form sidewalls 59 and 61 for the control gate, as well as sidewalls 57 for the select gates. At this time, source and drain areas 23 may be formed by ion implantation or other techniques.

Figure 20:
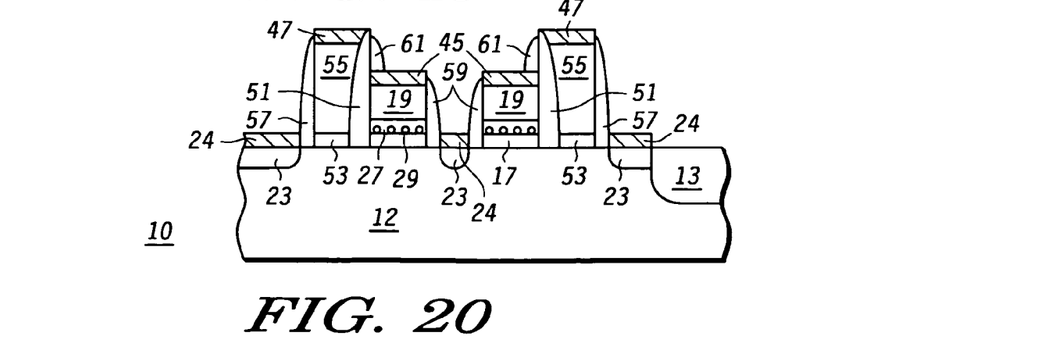
FIG. 20 is a cross-sectional view of the non-volatile memory device from FIG. 19 after silicidation of the select gates and control gates.

FIG. 20 is a cross sectional view of the memory device after processing has been done to form silicided select gates 47, silicided control gates 45, and silicided source and drain areas 24. A process as described previously may be done to accomplish the silicidation.

Figure 21:
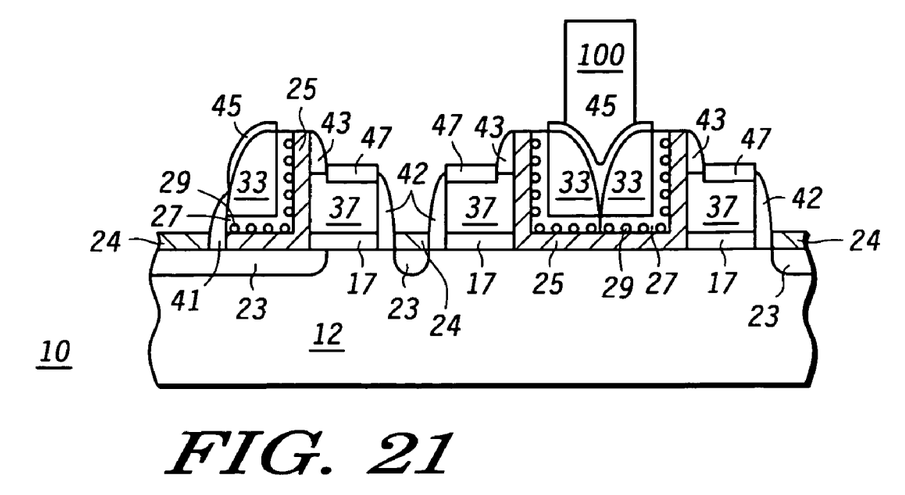
FIG. 21 is a cross-sectional view of a non-volatile memory device according to another embodiment of the present disclosure showing a contact to multiple silicided control gates.

The memory device after formation of a contact plug is shown in cross section in FIG. 21. The cross sectional view is based on the method provided to form the silicided sidewall spacer control gates 33 and recessed silicided select gates 37 from FIG. 8. In a preferred embodiment, a dielectric layer is first formed overlying the structure as shown in FIG. 20. The dielectric may be $SiO_2$, BPSG, PSG, a spin-on dielectric or the like. Planarization of the dielectric may be performed prior to the lithographic and etch processes. A conventional process is used to define a contact hole in the dielectric which will contact the underlying silicide of the control gate. Metallization of the contact is then done. This may include a barrier deposition and a CVD tungsten fill, followed by a CMP process to remove the overburden of tungsten. A selective tungsten process is also contemplated as is other metallization techniques known in the art. As noted previously, careful selection of the patterning of the control gates 33 will enable the contact to the control gates 33 as shown.

In one embodiment, a 2-bitcell memory device includes a split gate device that uses nanoclusters for charge storage in which both the select gates and the control gates have been silicided and whereby the select gates are recessed with respect to the control gates. The silicides for the control gates and select gates are separated from one another by at least a spacer material that overlies the conductive portion of the select gate. The nanoclusters are underlying the control gate portion of the memory device.

In another embodiment, a single bitcell memory device that uses nanoclusters for charge storage in which both the select gate and the control gate have been silicided and whereby the select gate is recessed with respect to the control gate is shown. The silicides for the control gate and select gate are separated from one another by at least a spacer material that overlies the conductive portion of the select gate. The nanoclusters are underlying the control gate portion of the memory device.

In another embodiment, a 2-bit storage cell that uses nanoclusters for charge storage in which both the select gate and the control gates have been silicided is shown. The control gates are recessed with respect to the select gate. The silicides for the control gates and select gate are separated from one another by at least a spacer material that overlies the nanoclusters. The nanoclusters are underlying the control gate portion of the memory device.

In another embodiment, a polish process is used to planarize a conductive layer for the control gates and select gates. Further processing recesses the select gates with respect to the control gates. Both select gates and control gates are silicided. At least a spacer material separates the silicide of the select gate from the silicide for the control gate. The nanoclusters are underlying the control gate portion of the memory device.

In yet another embodiment, a polish process is used to planarize a conductive layer for the selective gate portion of the memory device. The nanoclusters are formed underlying the control gate portion of the memory device. Again, both select gates and control gates are silicided and are separated from one another by at least a spacer material. In this embodiment, the control gates are recessed with respect to the select gate portions.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device, the method comprises:
   providing a semiconductor substrate;
   forming a first gate electrode having a first portion and a second portion over the semiconductor substrate, wherein the first gate electrode comprises silicon;
   forming a second gate electrode over the semiconductor substrate and laterally adjacent the first gate electrode, wherein the second gate electrode comprises silicon;
   recessing the first gate electrode below the second gate electrode after forming the first gate electrode and after forming the second gate electrode, wherein recessing comprises removing a first portion of the first gate electrode and leaving a second portion of the first gate electrode, wherein the second portion is under the first portion;
   forming a silicide resistant feature over a first portion of the first gate electrode;
   forming a first silicide over a second portion of the first gate electrode;
   forming a second silicide over the second gate electrode; and
   wherein forming the first silicide and forming the second silicide are performed simultaneously.

2. The method of claim 1, further comprising:
   forming a source region within the semiconductor substrate;
   forming a drain region with the semiconductor substrate;

forming a third silicide over the source region, wherein forming the third silicide is formed while forming the first silicide; and forming a fourth silicide over the drain region, wherein forming the fourth silicide is formed while forming the first silicide.

3. The method of claim 1, wherein forming a first gate electrode further comprises forming a select gate electrode; and wherein forming the second gate electrode further comprises forming a control gate electrode.

4. The method of claim 1, wherein forming a first gate electrode further comprises forming a control gate electrode; and wherein forming the second gate electrode further comprises forming a select gate electrode.

5. The method of claim 1, wherein recessing the first gate electrode further comprises:

forming a dielectric layer over the first gate electrode; and removing the dielectric layer over the first gate electrode.

6. The method of claim 1, wherein forming the second gate electrode further comprises:

forming a gate electrode material over the first gate electrode, wherein the gate electrode material includes silicon; and removing at least a portion of the gate electrode material to form the second gate electrode.

7. The method of claim 6, wherein removing at least a portion of the gate electrode material to form the second gate electrode comprises etching the gate electrode material.

8. The method of claim 1, further comprising:

forming a third gate electrode over the semiconductor substrate and adjacent the second gate electrode, wherein the third gate electrode comprises silicon;

forming a fifth silicide over the third gate electrode, wherein the fifth silicide is contiguous with the second silicide; and forming a contact over the second silicide and fifth silicide.

9. The method of claim 1, wherein forming a silicide resistant feature comprises:

forming a dielectric layer over the semiconductor substrate; and etching the dielectric layer.

10. The method of claim 1, wherein forming the first silicide further comprises forming the first silicide adjacent the silicide resistant feature.

11. A method for forming a semiconductor device, the method comprising:

providing a semiconductor substrate;

forming a first insulating layer over the semiconductor substrate;

forming a first gate electrode over the first insulating layer;

forming a nitride over the first gate electrode;

forming a second insulating layer over the semiconductor substrate, wherein the second insulating layer comprises discrete storage elements;

forming a second gate electrode over the second insulating layer;

forming a first sidewall spacer adjacent the second gate electrode;

recessing the first gate electrode below the second gate electrode after forming the first gate electrode and after forming the second gate electrode, wherein recessing occurs while removing at least one of the discrete storage elements;

forming a second sidewall spacer adjacent the first gate electrode;

removing the nitride over the first gate electrode;

forming a spacer over a first portion the first gate electrode after removing the nitride;

forming a first silicide over a second portion of the first gate electrode and adjacent the spacer;

forming a second silicide over the second gate electrode, wherein the second silicide is formed when forming the first silicide; and wherein forming the first sidewall spacer, forming the second sidewall spacer, and forming a spacer are formed simultaneously.

* * * * *